(12) United States Patent
Kim

(10) Patent No.: US 8,264,812 B2
(45) Date of Patent: Sep. 11, 2012

(54) SUBSTRATE-CHUCKING ELECTROSTATIC CHUCK, AND SUBSTRATE BONDING APPARATUS AND METHOD FOR LIQUID CRYSTAL DISPLAY PANEL USING THE SAME

(75) Inventor: Jong Won Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/474,970

(22) Filed: Jun. 27, 2006

(65) Prior Publication Data
US 2007/0121271 A1 May 31, 2007

(30) Foreign Application Priority Data
Nov. 29, 2005 (KR) .................. 10-2005-0114811

(51) Int. Cl.
*H01L 21/683* (2006.01)
(52) U.S. Cl. ....................................................... 361/234
(58) Field of Classification Search .................. 361/234
See application file for complete search history.

(56) References Cited

U.S. PATENT DOCUMENTS

| 5,377,071 | A | * | 12/1994 | Moslehi | 361/234 |
| 7,199,994 | B1 | * | 4/2007 | Levinson et al. | 361/234 |
| 2002/0008838 | A1 | * | 1/2002 | Matsuda | 349/187 |
| 2002/0062787 | A1 | * | 5/2002 | Hashizume et al. | 118/664 |
| 2003/0160937 | A1 | * | 8/2003 | Seok Lee et al. | 349/187 |
| 2003/0178468 | A1 | * | 9/2003 | Lee et al. | 228/102 |
| 2004/0226652 | A1 | | 11/2004 | Murata et al. | |
| 2005/0213279 | A1 | * | 9/2005 | Hayakawa | 361/234 |

FOREIGN PATENT DOCUMENTS

| CN | 1445588 | 10/2003 |
| JP | 2003-037159 | 2/2003 |

* cited by examiner

*Primary Examiner* — Rexford Barnie
*Assistant Examiner* — Tien Mai
(74) *Attorney, Agent, or Firm* — McKenna Long & Aldridge LLP

(57) ABSTRACT

A substrate-chucking electrostatic chuck (ESC) is disclosed which is sub-divided into at least three groups of electrostatic blocks, to uniformly chuck the substrate. A substrate bonding apparatus and method for a liquid crystal display (LCD) panel using the electrostatic chuck is also disclosed. The ESC includes at least three groups of electrostatic blocks which chuck the substrate using electrostatic chucking forces respectively generated by different voltages applied to the electrostatic blocks in association with the electrostatic block groups, and release the chucked substrate when the voltages are cut off.

1 Claim, 15 Drawing Sheets

SUBSTRATE-CHUCKING ELECTROSTATIC CHUCK, AND SUBSTRATE BONDING APPARATUS AND METHOD FOR LIQUID CRYSTAL DISPLAY PANEL USING THE SAME

This application claims the benefit of Korean Patent Application No. 10-2005-0114811, filed on Nov. 29, 2005, which is hereby incorporated by reference for all purposes as if fully set forth herein.

BACKGROUND OF THE INVENTION

1. Field of the Invention

The present invention relates to a substrate bonding apparatus for a liquid crystal display (LCD) panel, and more particularly, to a substrate-chucking electrostatic chuck (ESC) which is sub-divided into three different groups of electrostatic blocks, to uniformly chuck the substrate, and a substrate bonding apparatus and method for an LCD panel using the electrostatic chuck.

2. Discussion of the Related Art

With the progress of information-dependent society, the demand for various display devices has increased. To meet such a demand, efforts have recently been made to research flat panel display devices such as liquid crystal display devices (LCDs), plasma display panels (PDPs), electro-luminescent displays (ELDs), vacuum fluorescent displays (VFDs), and the like. Some types of such flat panel display devices are being practically applied to various appliances and products for display purposes.

In particular, LCDs have been used as a substitute for cathode ray tubes (CRTs) in association with mobile image display devices because LCDs have advantages of superior picture quality, lightness, thinness, and low power consumption. Thus, LCDs are currently the most widely used. Various applications of LCDs are being developed in association with not only mobile image display devices such as monitors of notebook computers, but also as TV monitors to receive and display broadcast signals.

Although LCDs have been variously developed so that they can be used as picture display devices in various fields, improving the quality of images in such LCD is made difficult by attempting to improve the above-mentioned features and advantages.

Accordingly, successful applications of such LCDs to diverse image display devices depend on whether or not the LCDs can realize desired high picture quality including high resolution, high brightness, large display area, and the like, while maintaining desired characteristics of lightness, thinness, and low power consumption.

Methods for manufacturing the above-mentioned LCDs are mainly classified into liquid crystal injection type methods and liquid crystal dispensing type methods. In the liquid crystal injection method, a sealant pattern is written on one of upper and lower substrate such that the sealant pattern has an injection port. Thereafter, the substrates are bonded to each other under a vacuum condition. A liquid crystal material is then injected into a space defined between the substrates through the injection port. In the liquid crystal dispensing method, one substrate is prepared on which a liquid crystal material has been dispensed. Another substrate is prepared on which a sealant pattern is formed such that the sealant pattern extends completely along the peripheral edge of the substrate without forming an injection port. Thereafter, the latter substrate is arranged on the former substrate under a vacuum condition such that they are aligned with each other. The aligned substrates are then bonded to each other. Such a liquid crystal dispensing method is disclosed in Japanese Patent Application Nos. Heisei 11-089612 and Heisei 11-172903.

The liquid crystal dispensing method has an advantage in that the liquid crystal dispensing method uses a reduced number of processes in accordance with elimination of certain processes required in the liquid crystal injection method, for example, processes for forming a liquid crystal injection port, injecting a liquid crystal material, and sealing an injection port, and thus, does not use or require equipment for those processes.

For this reason, active research has recently been made to provide more efficient equipment for use in the liquid crystal dispensing method.

For example, the applicant proposed a substrate bonding apparatus for an LCD panel through Korean Patent Application No. 2002-71366 (Filing date: Nov. 16, 2002).

Where it is desired to bond an upper substrate (or a lower substrate) to a lower substrate (or an upper substrate) coated with a sealant along the peripheral edge of the lower substrate, and dispensed with a liquid crystal material, using the substrate bonding apparatus proposed by the applicant, the upper substrate is first chucked to an upper electro-static chuck (ESC), and is then lowered such that the upper substrate approximates to the lower substrate. The upper ESC is then turned off, thereby releasing the upper substrate which is, in turn, laid on the lower substrate. In this state, the substrate bonding apparatus performs a venting process to bond the upper and lower substrates to each other.

In the above-mentioned related art substrate bonding apparatus, the upper ESC thereof includes a plurality of electrostatic blocks classified into two groups to which different voltages are supplied, respectively.

Each electrostatic block of each electrostatic block group chucks a substrate using an electrostatic chucking force generated when a voltage associated with the electrostatic block group is applied from a voltage source to the electrostatic block. The electrostatic chucking force is released when the voltage applied to the electrostatic block is cut off. In accordance with the release of the electrostatic chucking force, the chucked substrate is separated from the upper ESC to fall down.

However, the ESC used in the above-mentioned related art substrate bonding apparatus has a problem in that uniformity of chucking of a substrate and release of the chucked substrate cannot be enhanced because the chucking and release are achieved by simply applying voltages to the associated electrostatic blocks and simply cutting off the applied voltages, respectively. That is, the related art ESC cannot uniformly chuck the substrate using two different groups of electrostatic blocks because the substrate may be bent due to its weight. Furthermore, the substrate may not fall down uniformly when the voltages applied to the ESC are cut off.

SUMMARY OF THE INVENTION

Accordingly, the present invention is directed to a substrate-chucking ESC, and a substrate bonding apparatus and method for an LCD panel using the same that substantially obviate one or more problems due to limitations and disadvantages of the related art.

An advantage of the present invention is to provide a substrate-chucking ESC which is sub-divided into at least three groups of electrostatic blocks, to uniformly chuck the substrate and to uniformly release the chucked substrate, and a substrate bonding apparatus and method for an LCD panel using the ESC.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, an electrostatic chuck for electrostatically chucking a substrate comprises: at least three groups of electrostatic blocks which chuck the substrate using electrostatic chucking forces respectively generated by different voltages applied to the electrostatic blocks in association with the electrostatic block groups, and release the chucked substrate when the voltages are cut off.

In another aspect of the present invention, a substrate bonding apparatus for a liquid crystal display panel comprises upper and lower electrostatic chucks for electrostatically chucking a first substrate and a second substrate, respectively, to bond the first and second substrates, wherein the upper electrostatic chuck comprises at least three groups of electrostatic blocks which chuck the first substrate using electrostatic chucking forces respectively generated by different voltages applied to the electrostatic blocks in association with the electrostatic block groups, and release the chucked substrate when the voltages are cut off.

In still another aspect of the present invention, a method for bonding a first substrate and a second substrate, comprises the steps of: applying different voltages to at least three groups of electrostatic blocks constituting an upper electrostatic chuck, respectively, thereby chucking the first substrate to the upper electrostatic chuck; applying different voltages to at least three groups of electrostatic blocks constituting a lower electrostatic chuck, respectively, thereby chucking the second substrate, which has been dispensed with a liquid crystal material, to the lower electrostatic chuck; and bonding the first and second substrates respectively chucked to the upper and lower electrostatic chucks.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the embodiments of the present invention, examples of which are illustrated in the accompanying drawings, namely FIGS. 1 to FIG. 14B. Wherever possible, the same reference numbers will be used throughout the drawings to refer to the same or like parts.

Figure 1:
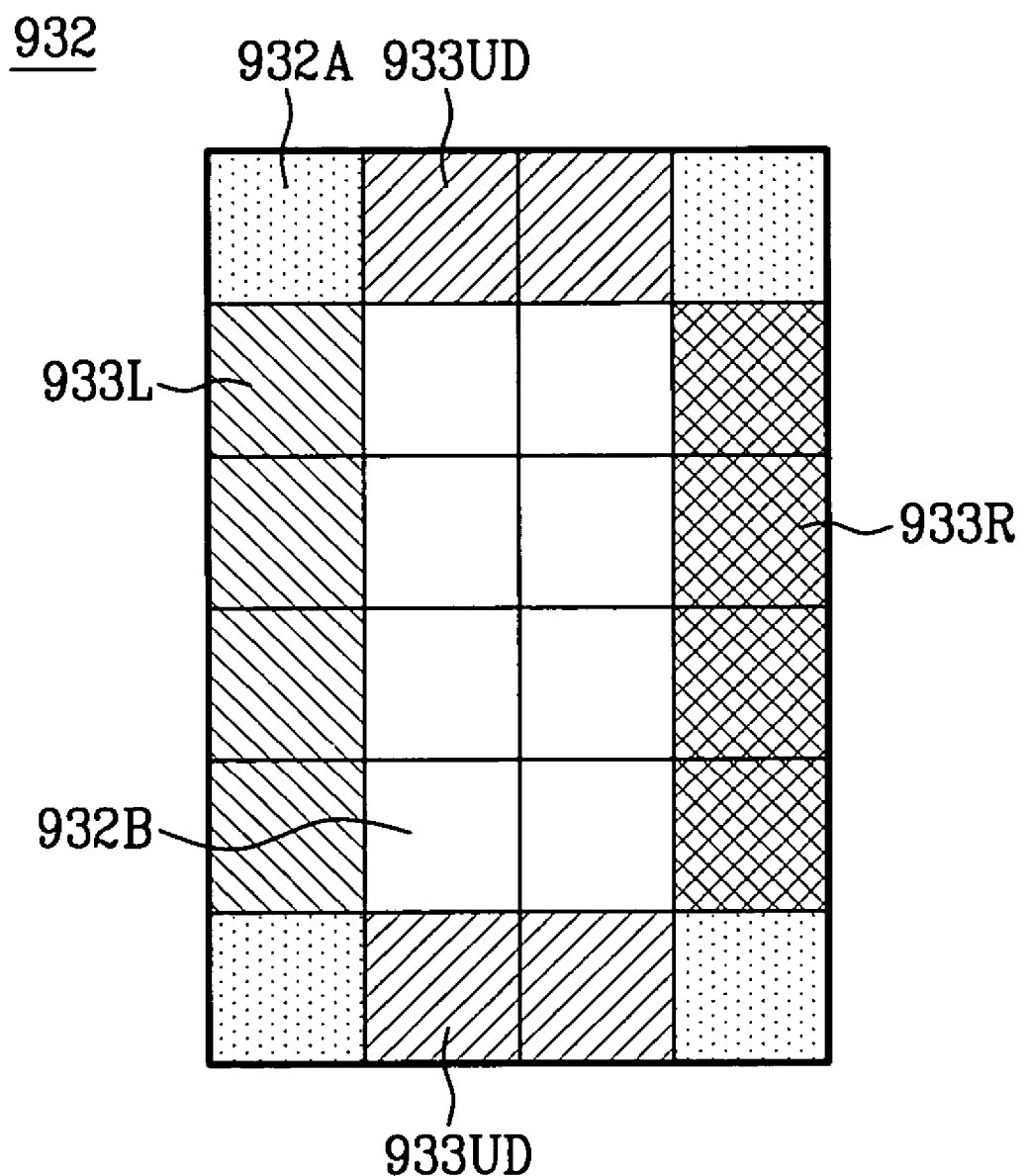
FIG. 1 is a schematic view illustrating a substrate-chucking ESC according to an exemplary embodiment of the present invention.

FIG. 1 schematically illustrates a substrate-chucking ESC according to an exemplary embodiment of the present invention.

As shown in FIG. 1, the ESC 932 according to the illustrated embodiment of the present invention includes at least three groups of electrostatic blocks which chuck a substrate using electrostatic chucking forces generated when different voltages respectively associated with the groups of the electrostatic blocks are applied to the associated electrostatic blocks, respectively, and release the chucked substrate when the voltages are cut off.

That is, the ESC 932 includes 4 first electrostatic blocks 932A arranged at respective corner portions of the ESC 932, a plurality of second electrostatic blocks 932B arranged at a central portion of the ESC 932, and a plurality of third electrostatic blocks 933 arranged at portions of the ESC 932 other than the central and corner portions of the ESC 932, namely, edge portions of the ESC 932.

The first electrostatic blocks 932A electrostatically chuck respective corner portions of a substrate using an electrostatic chucking force generated by a first voltage externally applied to the first electrostatic blocks 932A, and release the chucked corner portions of the substrate when the first voltage is cut off.

The second electrostatic blocks 932B electrostatically chuck the central portion of the substrate, except for the edge portions of the substrate, using an electrostatic chucking force generated by a second voltage externally applied to the second electrostatic blocks 932B, and release the chucked central portion of the substrate when the second voltage is cut off. The second voltage is different from the first voltage. The second electrostatic blocks 932B may be arranged in a 2×4 matrix array.

The third electrostatic blocks 933 are divided into a plurality of upper and lower electrostatic blocks 933UD arranged in a shorter-axis direction of the ESC 932 at the upper and lower edge portions of the ESC 932, respectively, a plurality of left electrostatic blocks 933L arranged at a left edge portion of the ESC 932, and a plurality of right electrostatic blocks 933R arranged at a right edge portion of the ESC 932.

The upper and lower electrostatic blocks 933UD electrostatically chuck the upper and lower edge portions of the substrate, except for the corner portions of the substrate, using an electrostatic chucking force generated by a third voltage externally applied to the upper and lower electrostatic blocks 933UD, and release the chucked upper and lower edge portions of the substrate when the third voltage is cut off, respectively. The third voltage is different from either of the first and second voltages. The number of upper or lower electrostatic blocks 933UD may be two. In other embodiments, the number of upper or lower electrostatic blocks may be less than or more than two.

The left electrostatic blocks 933L electrostatically chuck the left edge portion of the substrate, except for the corner portions of the substrate, using an electrostatic chucking force generated by a fourth voltage externally applied to the left electrostatic blocks 933L, and release the chucked left edge portion of the substrate when the fourth voltage is cut off. The fourth voltage is different from any of the first through third voltages. The number of the left electrostatic blocks 933L may be four.

The right electrostatic blocks 933R electrostatically chuck the right edge portion of the substrate, except for the corner portions of the substrate, using an electrostatic chucking force generated by a fifth voltage externally applied to the right electrostatic blocks 933R, and release the chucked right edge portion of the substrate when the fifth voltage is cut off. The fifth voltage is different from any of the first through fourth voltages. The number of the right electrostatic blocks 933R may be four.

Figure 2:
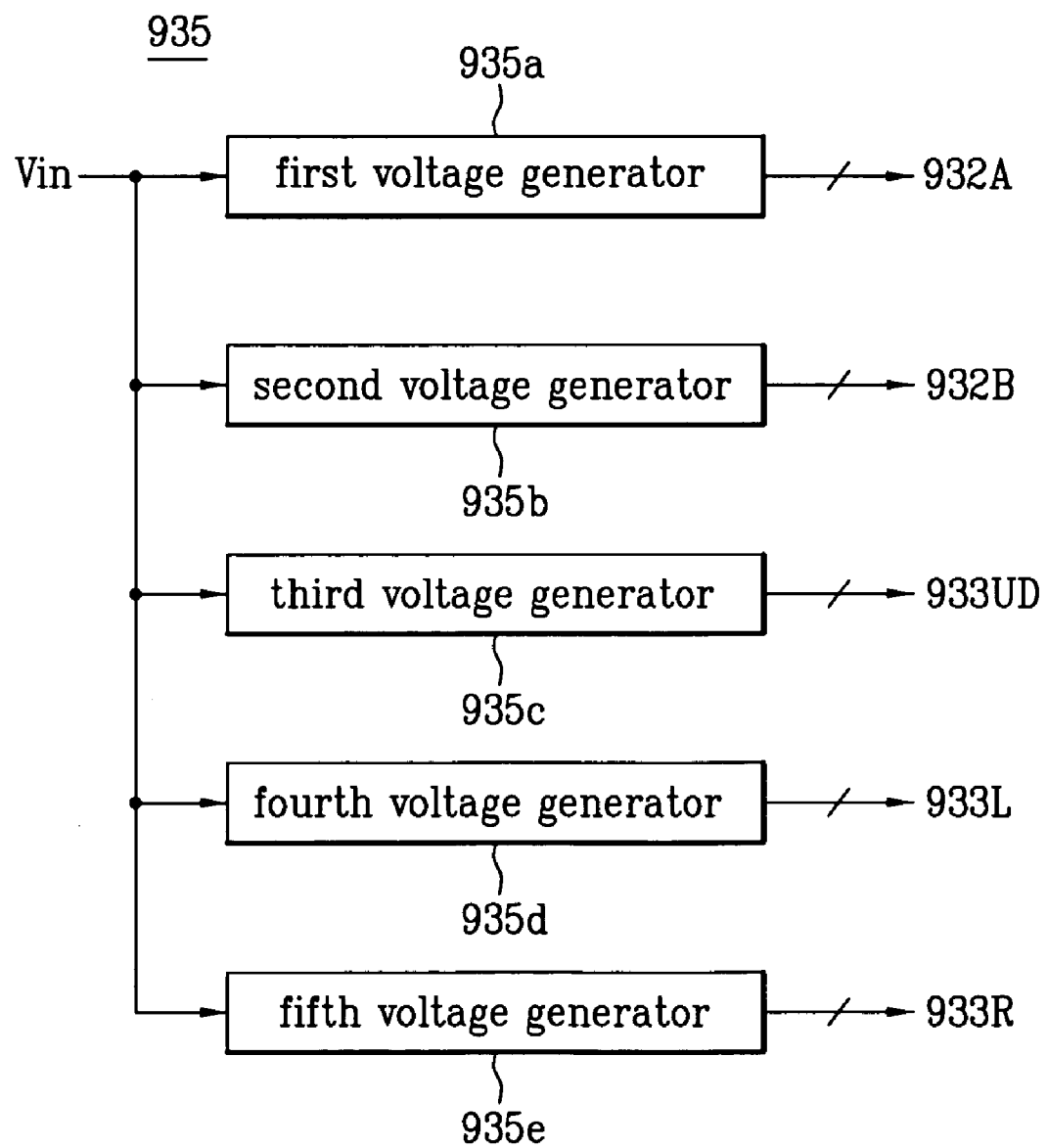
FIG. 2 is a block diagram illustrating an ESC driver which supplies voltages to the ESC shown in FIG. 1.

FIG. 2 illustrates an ESC driver which supplies voltages to the substrate-chucking ESC shown in FIG. 1.

The ESC driver 935 includes a first voltage generator 935a which generates the first voltage, and supplies the first voltage to the first electrostatic blocks 932A, and a second voltage generator 935b which generates the second voltage, and supplies the second voltage to the second electrostatic blocks 932B. The ESC driver 935 further includes a third voltage generator 935c which generates the third voltage, and supplies the third voltage to the upper and lower electrostatic blocks 933UD; a fourth voltage generator 935d which generates the fourth voltage, and supplies the fourth voltage to the left electrostatic blocks 933L; and a fifth voltage generator 935e which generates the fifth voltage, and supplies the fifth voltage to the right electrostatic blocks 933R.

The first voltage generator 935a generates the first voltage using an input voltage Vin externally applied to the first voltage generator 935a, and supplies the first voltage to the first electrostatic blocks 932A.

The second voltage generator 935b generates the second voltage, which is different from the first voltage, using the input voltage Vin, and supplies the second voltage to the second electrostatic blocks 932B.

The third voltage generator 935c generates the third voltage, which is different from the first and second voltages, using the input voltage Vin, and supplies the third voltage to the upper and lower electrostatic blocks 933UD.

The fourth voltage generator 935d generates the fourth voltage, which is different from the first through third voltages, using the input voltage Vin, and supplies the fourth voltage to the left electrostatic blocks 933L.

The fifth voltage generator 935e generates the fifth voltage, which is different from the first through fourth voltages, using the input voltage Vin, and supplies the fifth voltage to the right electrostatic blocks 933R.

Thus, the substrate-chucking ESC 932 according to the illustrated embodiment of the present invention can electrostatically chuck a substrate supplied from the outside of the ESC 932 using electrostatic chucking forces respectively generated by the first through fifth voltages supplied from the first through fifth voltage generators 935a to 935e to the respective electrostatic blocks 932A, 932B, 933UD, 933L, and 933R.

When the first through fifth voltages supplied from the first through fifth voltage generators 935a to 935e to the respective electrostatic blocks 932A, 932B, 933UD, 933L, and 933R are cut off, the electrostatic forces are removed. As a result, the substrate-chucking ESC 932 releases the substrate, so that the substrate falls down.

Thus, the substrate-chucking ESC 932 according to the illustrated embodiment of the present invention can chuck a substrate and can release the chucked substrate by individually controlling voltages respectively applied to at least three groups of electrostatic blocks, thereby enhancing the uniformity of the chucking of the substrate and the uniformity of the release of the chucked substrate. That is, the substrate-chucking ESC 932 according to the illustrated embodiment of the present invention can uniformly chuck the substrate using at least three groups of electrostatic blocks even when the substrate would otherwise be bent due under its own weight, and can allow the chucked substrate to fall down uniformly when the voltages applied to the ESC 932 are cut off.

Figure 3:
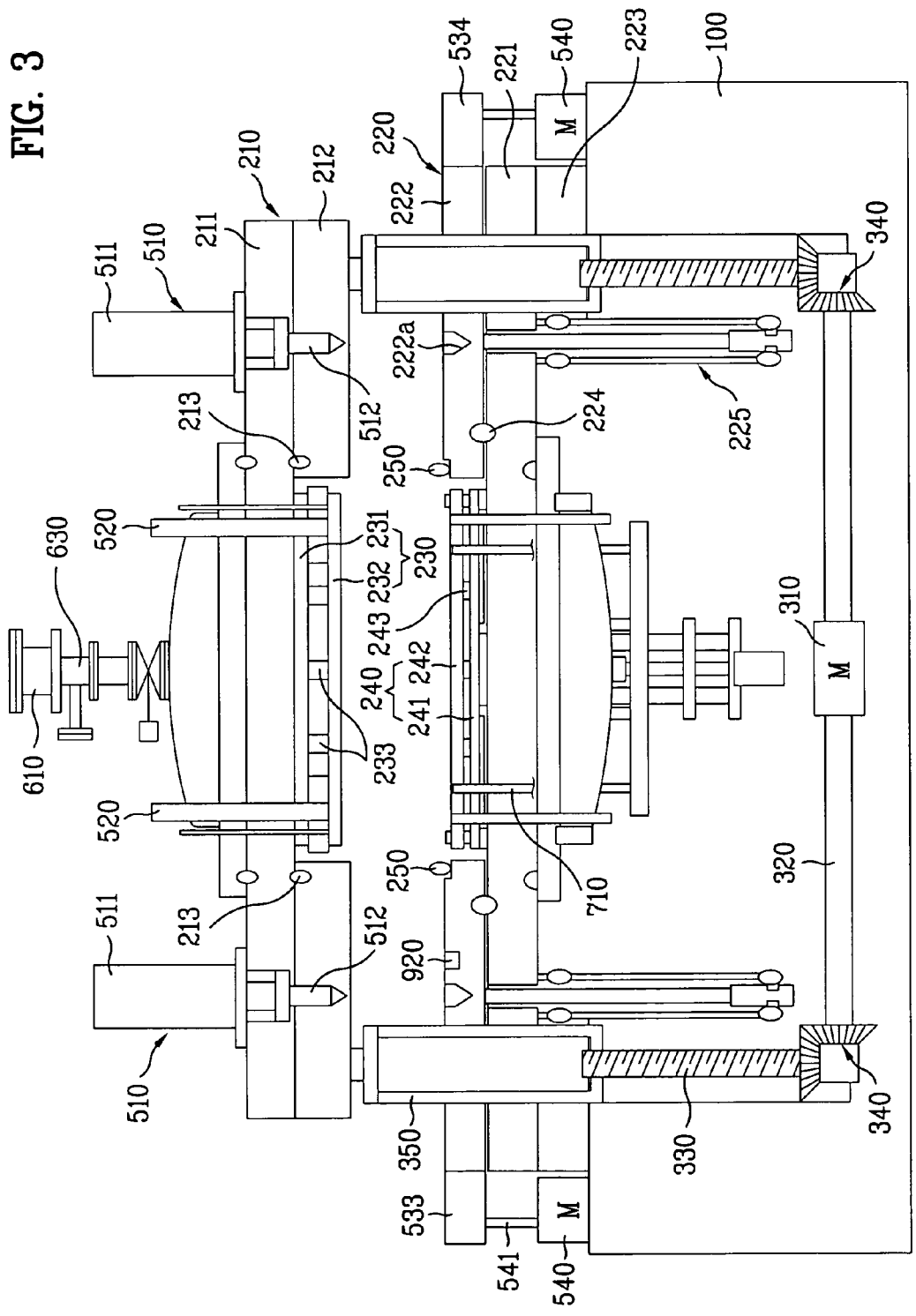
FIG. 3 is a schematic view illustrating an initial state of a substrate bonding apparatus for an LCD panel according to the present invention.

FIG. 3 illustrates an initial state of a substrate bonding apparatus for an LCD panel which uses the substrate-chucking ESC according to the illustrated embodiment of the present invention.

As shown in FIG. 3, the substrate bonding apparatus includes a base frame 100, an upper chamber unit 210, a lower chamber unit 220, a chamber mover, an upper stage 230, a lower stage 240, a sealer, alignment identifying cameras 520, an aligner, a linker 510, supporters 710, and vacuum pump units 610, 621, and 622.

The base frame 100, which is included in the substrate bonding apparatus of the present invention, is fixed to the ground. The base frame 100 defines the appearance of the substrate bonding apparatus, and functions to support desired constituent elements of the substrate bonding apparatus.

The upper and lower chamber units 210 and 220 are mounted to upper and lower ends of the base frame 100, respectively, such that the upper and lower chamber units 210 and 220 are inter-connectable.

The upper chamber unit 210 includes an upper base 211 which is exposed to an external environment, and an upper chamber plate 212 which is fixed to a lower surface of the upper base 211 while being in close contact with the lower surface of the upper base 211. The upper chamber plate 212 has a rectangular frame structure such that a certain space is defined in the upper chamber plate 212.

The upper stage 230 is arranged in the space defined in the upper chamber plate 212. The upper stage 230 is mounted to the upper chamber unit 210 such that the upper stage 230 is linked to the upper chamber unit 210.

A seal member 213 is interposed between the upper base 211 and upper chamber plate 212 which constitute the upper chamber unit 210, to isolate the inner space of the upper chamber plate 212 from the outside of the upper chamber plate 212. The seal member 213 will be referred to as a "first seal member", hereinafter.

The lower chamber unit 220 includes a lower base 221 that is fixed to the base frame 100, and a lower chamber plate 222 that is mounded to an upper surface of the lower base 221 such that the lower chamber plate 222 is movable in forward, rearward, left and right directions. The lower chamber plate 222 has a rectangular frame structure such that a certain space is defined in the lower chamber plate 222.

The lower stage 240 is arranged in the space defined in the lower chamber plate 222. The lower stage 240 is mounted to the upper surface of the lower base 221.

In accordance with the illustrated embodiment of the present invention, the lower chamber unit 220 may further include a support plate 223 arranged between the base frame 100 and the lower base 221, to provide stable inter-fixing of the base frame 100 and lower base 221.

A seal member 224 is interposed between the lower base 221 and lower chamber plate 222 which constitute the lower chamber unit 220, to isolate the inner space of the lower chamber plate 222 from the outside of the lower chamber plate 222. The lower stage 240 is arranged in the inner space of the lower chamber plate 222. The seal member 224 will be referred to as a "second seal member", hereinafter.

At least one support member 225 is arranged between the lower base 221 and the lower chamber plate 222, in order to support the lower chamber plate 222 such that the lower chamber plate 222 is maintained in a state of being spaced apart from the lower base 221 by a predetermined distance.

The support member 225 is fixed, at one end thereof, to a lower surface of the lower chamber plate 222. The other end of the support member 225 is connected to a lower portion of the lower base 221 in a state of being horizontally freely movable.

Accordingly, the lower chamber plate 222 is freely movable with respect to the lower base 221 by the support member 225. Thus, the lower chamber plate 222 is movable in forward, rearward, left and right directions.

The chamber mover includes a drive motor 310 which is fixed to the base frame 100, drive shafts 320 which are axially coupled to the drive motor 310, and connecting shafts 330, which extend in a direction perpendicular to the drive shafts 320, and receive drive forces from the drive shafts 320, respectively. The chamber mover also includes connectors 340, each of which connects an associated one of the connecting shafts 330 to an associated one of the drive shafts 320, and jacks 350, each of which is mounted to an end of an associated one of the connecting shafts 330.

The drive motor 310 comprises a dual-shaft motor which is arranged in the bottom of the base frame 100 inside the base frame 100, and is provided with shafts extending in parallel to the ground in opposite directions.

The drive shafts 320 are connected to respective shafts of the drive motor 310, to transmit the drive force of the drive motor 310 in a direction parallel to the shafts of the drive motor 310. On the other hand, the connecting shafts 330 are connected to the drive shafts 320, to transmit the drive forces from the drive shafts 320 in a direction perpendicular to the drive shafts 320, respectively.

The jack 350 mounted to each connecting shaft 330 functions to move the upper chamber unit 210 while moving upwardly or downwardly in accordance with the rotation direction of the connecting shaft 330 in a state of being in contact with the upper chamber unit 210. The jack 350 has a nut housing structure.

Each connector 340 is made of bevel gears that are meshed with each other to vertically transmit a rotating force horizontally transmitted from the associated drive shaft 320 to the associated connecting shaft 330.

The upper stage 230 includes an upper fixing plate 231 fixed to the upper chamber unit 210, an upper chucking plate 232, to which a first substrate is chucked, and a plurality of fixing blocks 233 arranged between the upper fixing plate 231 and the upper chucking plate 232. Similarly, the lower stage 240 includes a lower fixing plate 241 fixed to the lower chamber unit 220, a lower chucking plate 242, to which a second substrate is chucked, and a plurality of fixing blocks 243 arranged between the lower fixing plate 241 and the lower chucking plate 242.

Each of the upper and lower chucking plates 232 and 242 is constituted by an electrostatic chuck (ESC) which electrostatically chucks a substrate. The ESC constituting each of the upper and lower chucking plates 232 and 242 has the same configuration as the substrate-chucking ESC according to the embodiment of the present invention illustrated in FIG. 1.

The sealer is constituted by an O-ring 250 which is mounted on an upper surface of the lower chamber plate 222 included in the lower chamber unit 220 such that the O-ring 250 is upwardly protruded to a certain level. The O-ring 250 will be referred to as a "third seal member", hereinafter. The third seal member 250 is made of a rubber material.

The third seal member 250 has a thickness preventing the first and second substrates 110 and 120 respectively chucked to the upper and lower stages 230 and 240 arranged in the chamber units 210 and 220 from coming into contact with each other when the chamber units 210 and 220 are coupled to each other. Of course, when the third seal member 250 is compressed, it has a thickness reduced to allow the first and second substrates 110 and 120 to come into contact with each other.

The aligner is arranged in the lower chamber unit 220, to perform identification of the positions of the substrates 110 and 120, and alignment of the substrates 110 and 120.

The linker 510 functions to link the chamber units 210 and 220 such that the chamber units 210 and 220 move equally in the same direction.

The linker 510 includes a plurality of receiving grooves 222a formed at the lower chamber plate 222 of the lower chamber unit 220, and a plurality of linear actuators 511 each fixed, at one end thereof, to the upper chamber unit 210 and adapted to move a moving shaft 512 such that the moving shaft 512 is receivable in an associated one of the receiving grooves 222a.

The aligner and linker do not cause a displacement of the lower stage 240, but cause a movement of the lower chamber unit 220, thereby causing a displacement of the upper stage 230. As a result, alignment of the first and second substrates 110 and 120 is carried out.

The supporters 710 are upwardly protruded through the lower stage 240, to seat the second substrate 120 on the lower stage 240 during loading of the second substrate 120, or to unload the first and second substrate 110 and 120 bonded to each other from the lower stage 240. Each supporter 710 has a lift pin structure.

Of course, the upper ends of the supporters 710 are arranged below the upper surface of the lower stage 240 when loading of the second substrate 120 is not carried out.

The vacuum pump units 610, 621, and 622 are arranged in at least one of the chamber units 210 and 220, to form a vacuum in the inner spaces of the chamber units 210 and 220.

Figure 4:
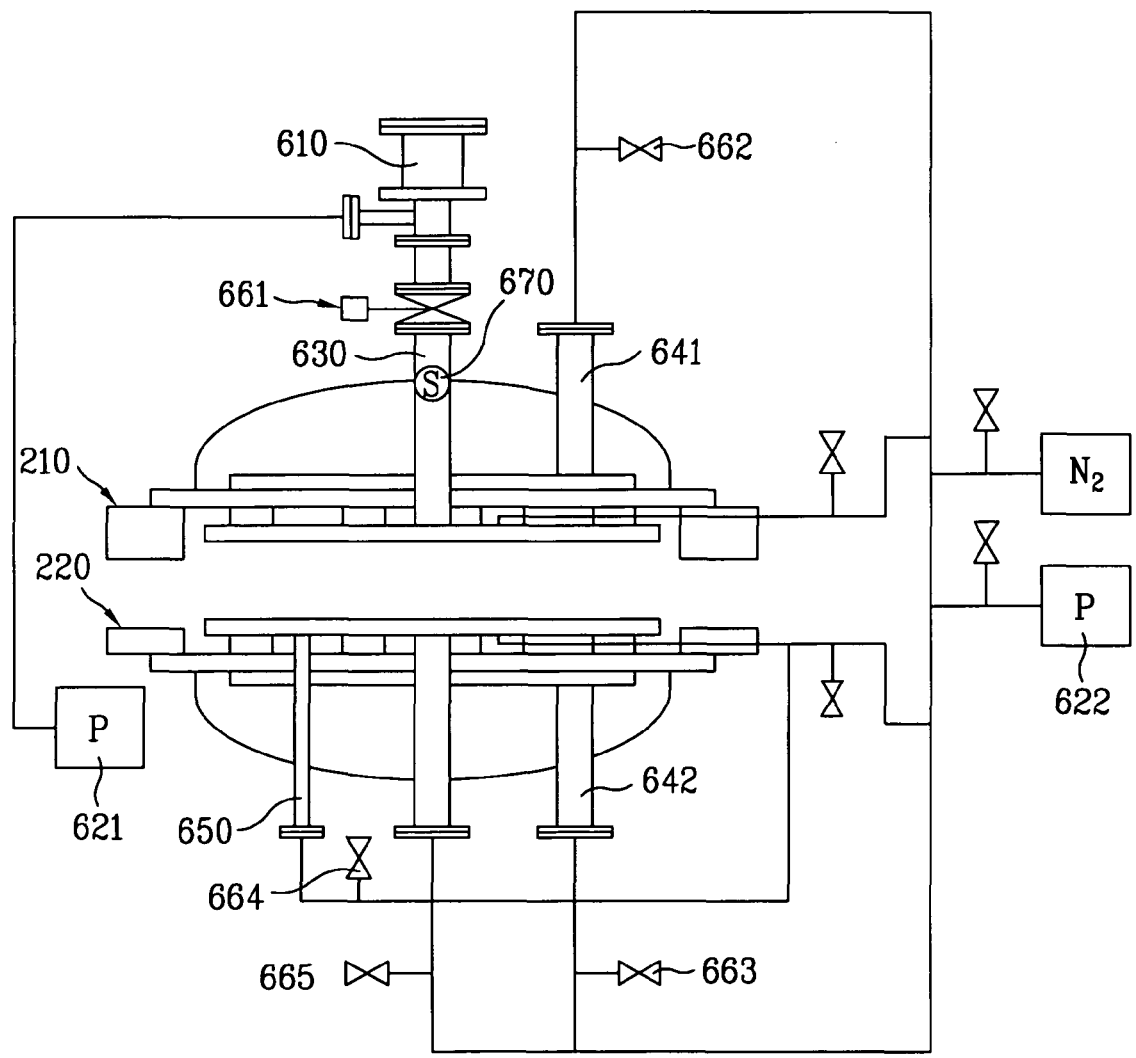
FIG. 4 is a schematic view illustrating a connection state of vacuum pumps in the substrate bonding apparatus according to the present invention.

As shown in FIG. 4, each of the vacuum pump units 610, 621, and 622 includes a high-vacuum pump 610 which may be a turbo molecular pump (TMP), and two low-vacuum pumps 621 and 622, each of which may be a dry pump.

One of the low-vacuum pumps 621 and 622, for example, the low-vacuum pump 621 (hereinafter, referred to as a "first low-vacuum pump"), is connected to a high-vacuum chamber conduit 630, which extends through a central portion of the upper chamber unit 210 and connects the inner spaces of the chamber units 210 and 220 to the high-vacuum pump 610 in order to form a vacuum reaching a predetermined negative pressure in the inner spaces.

The other low-vacuum pump 622, namely, the low-vacuum pump 622 (hereinafter, referred to as a "second low-vacuum pump"), is connected to low-vacuum chamber conduits 641 and 642 respectively extending through lateral walls of the upper and lower chamber units 210 and 220. The second low-vacuum pump 622 is also connected to a substrate chucking conduit 650 connected to passages respectively defined in the stages 230 and 240 for vacuum-chucking of the substrates.

At least one opening/closing valve is arranged in each of the conduits 630, 641, 642, and 650. In FIG. 3, the opening/closing valves are designated by reference numerals 661, 662, 663, 664, and 665.

A pressure sensor 670 is arranged in the high-vacuum chamber conduit 630. The pressure sensor 670 measures the internal pressure of the inner spaces of the chamber units 210 and 220 where the substrates are arranged.

The conduits 641, 642, and 650, to which the second low-vacuum pump 622 is connected, are also used as venting conduits. In a venting process, gas, for example, $N_2$ gas, is injected into the inner space of each chamber unit 210 or 220 maintained in a vacuum state, to change the inner space to an atmospheric state, via the conduits 641, 642, and 650.

The alignment identifying cameras 520 observe alignment marks (not shown) formed on the substrates 110 and 120 to monitor the alignment of the substrates 110 and 120. Each alignment identifying camera 520 is mounted to the upper chamber unit 210 (or the lower chamber unit 220) such that the alignment identifying camera 520 extends through the upper chamber unit 210 (or the lower chamber unit 220).

Hereinafter, a process for bonding the substrates using the substrate bonding apparatus having the above-described configuration according to the illustrated embodiment of the present invention will be described in detail.

Figure 5:
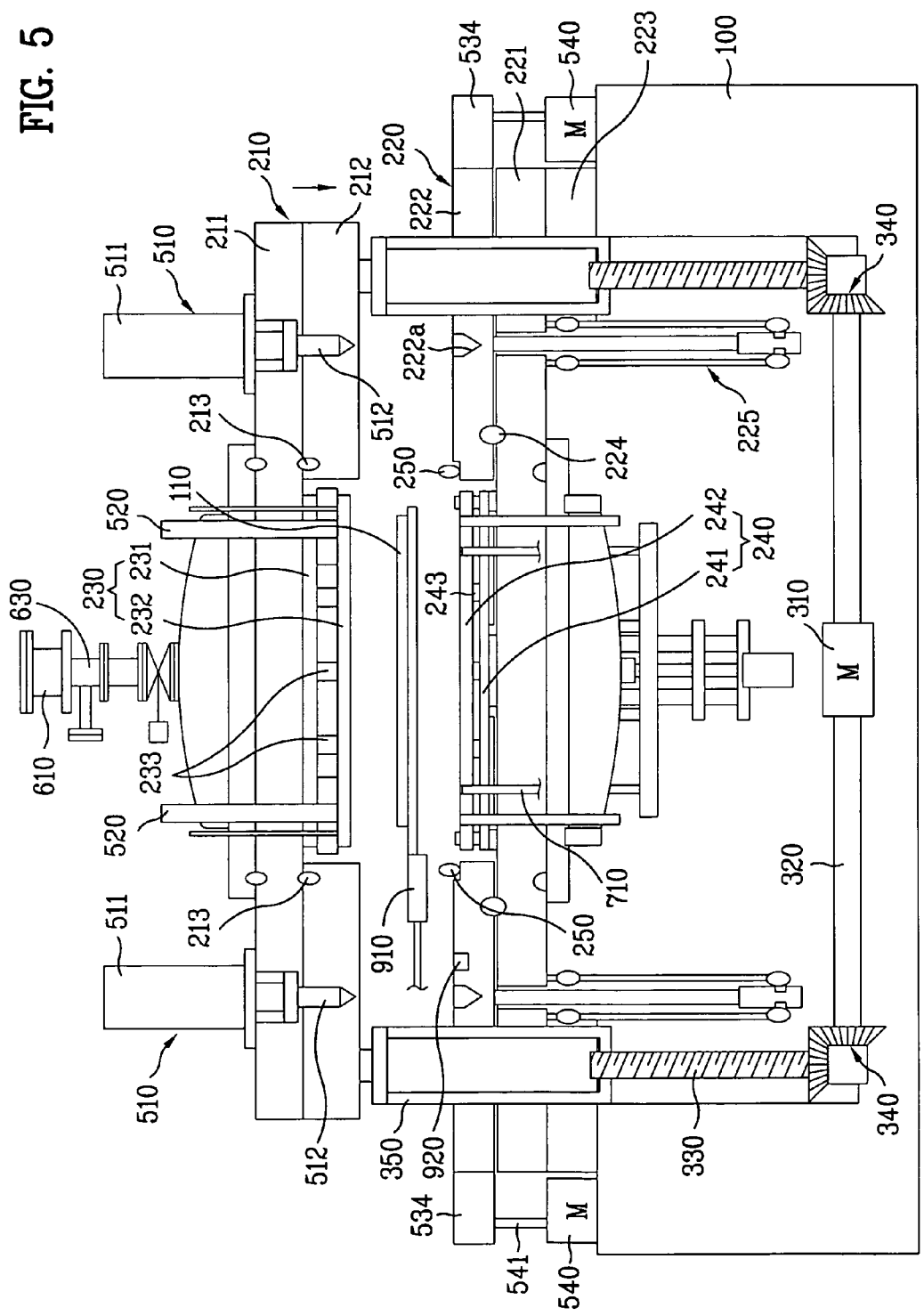
FIG. 5 is a schematic view illustrating a substrate loading procedure carried out by a loader in the substrate bonding apparatus according to the present invention.

In the substrate bonding process, the first substrate 110 coated with the sealant is transferred from an initial position shown in FIG. 3 to a space defined between the chamber units 210 and 220 by the loader 910, for loading of the first substrate 110, as shown in FIG. 5.

Figure 6:
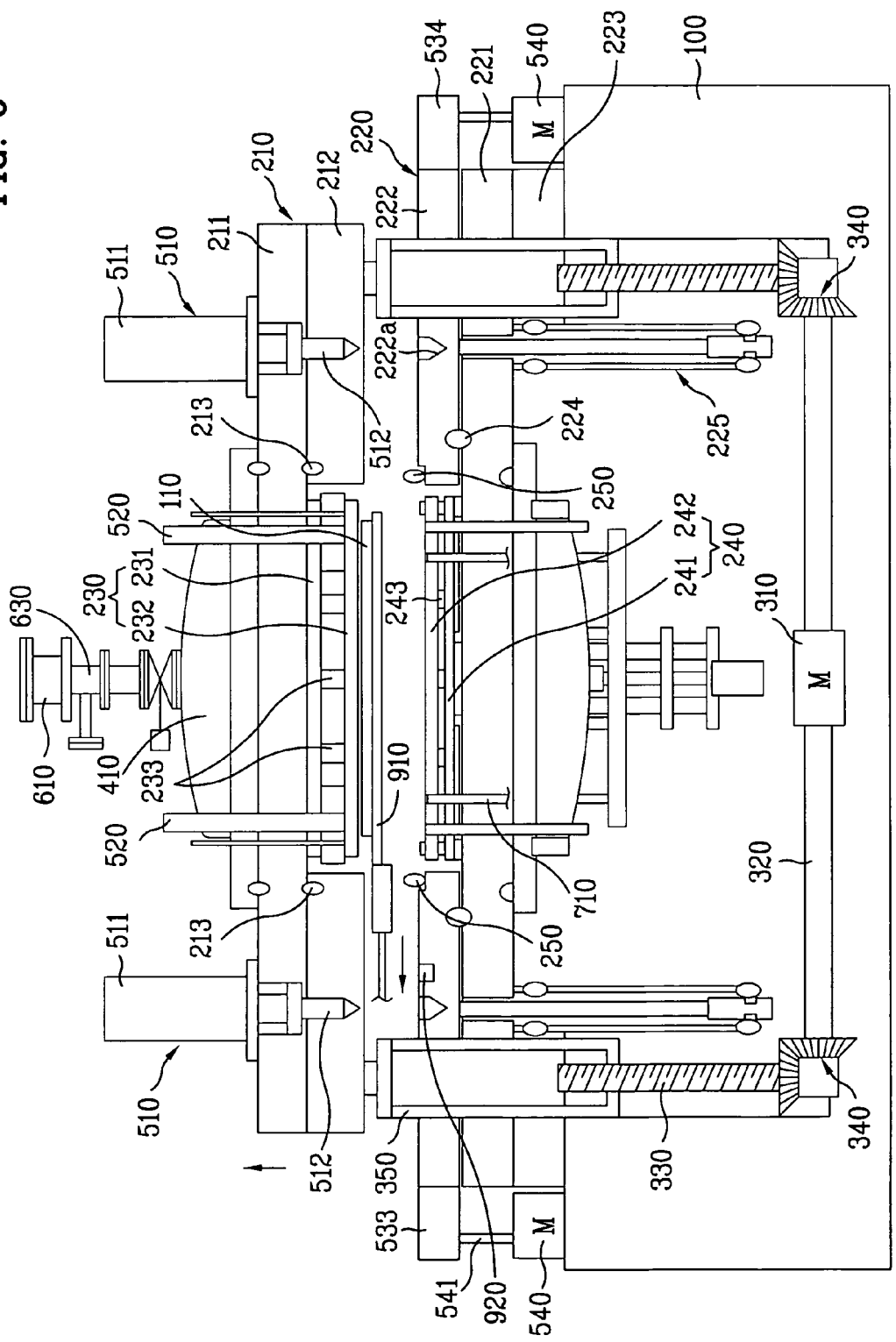
FIGS. 6 and 7 are schematic views illustrating a procedure for fixing a first substrate to an upper stage in the substrate bonding apparatus according to the present invention.

The first substrate 110 loaded in the above-described manner is then attached to the upper stage 230 in accordance with a downward movement of the upper chamber, a vacuum chucking operation of the second low-vacuum pump 622, and an electrostatic chucking operation of an upper ESC constituting the chucking plate 232, as shown in FIG. 6. In this case, it is possible to uniformly chuck the first substrate 110 to the upper ESC by individually controlling voltages respectively applied to at least three groups of electrostatic blocks constituting the upper ESC, as shown in FIG. 1.

Figure 7:
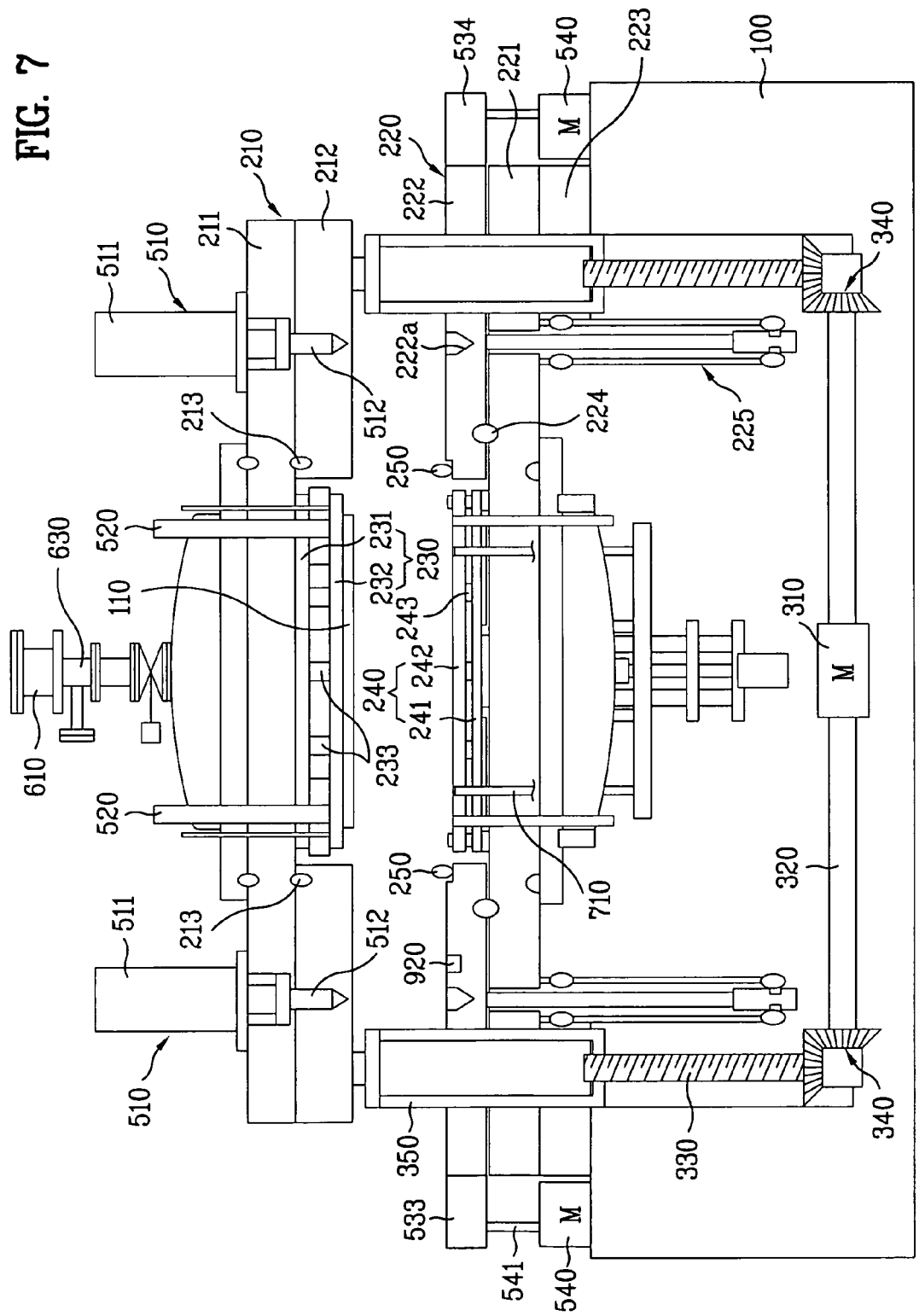

After completion of the attachment of the first substrate 110 to the upper stage 230, the loader 910 retracts from the space between the chamber units 210 and 220, as shown in FIG. 7. The upper chamber unit 210 then returns to an initial position thereof while moving upwardly.

Figure 8:
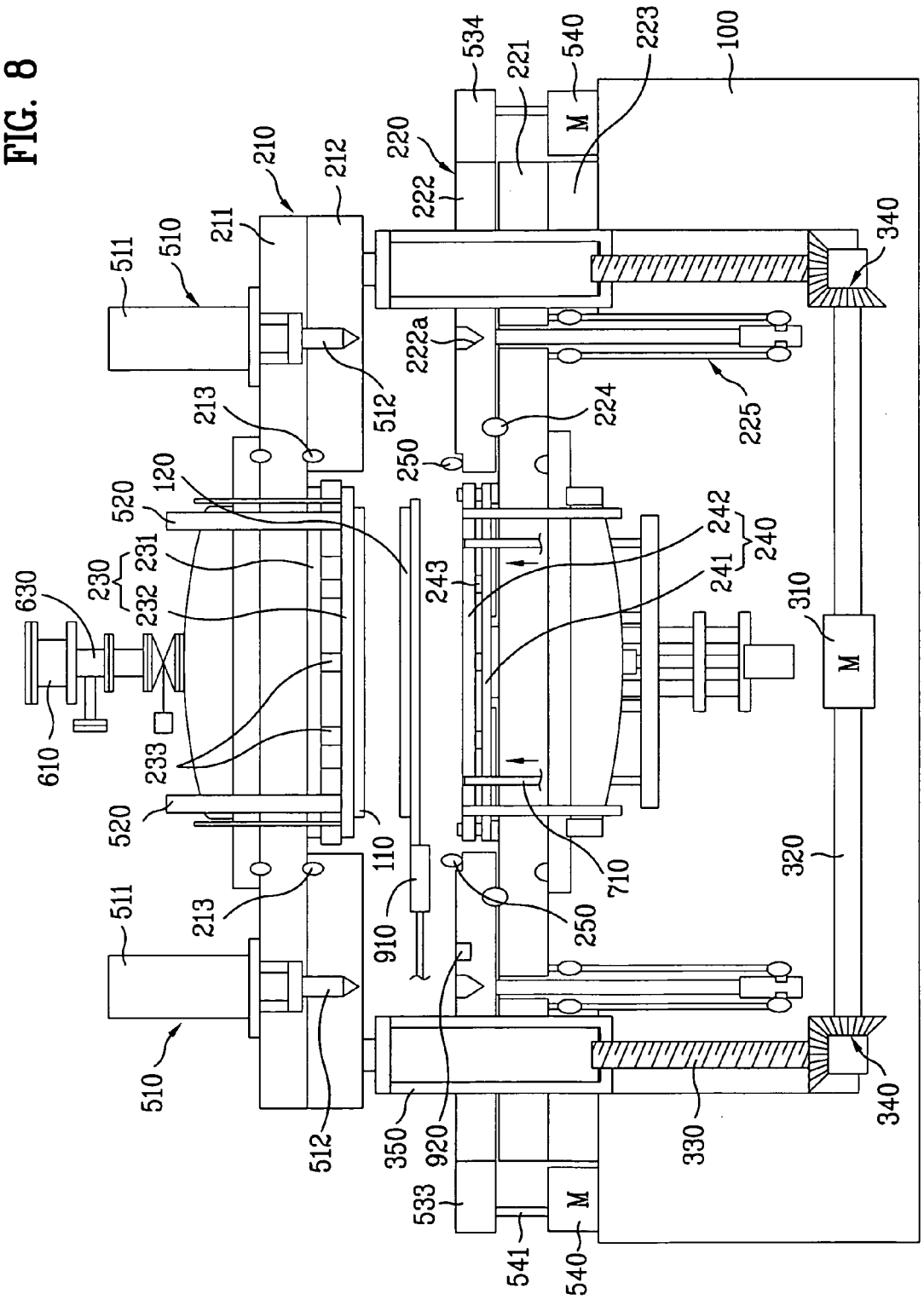
FIGS. 8 to 10 are schematic views illustrating procedures for loading a second substrate and fixing the second substrate to a lower stage in the substrate bonding apparatus according to the present invention.

Thereafter, the loader 910 extends again to the space between the chamber units 210 and 220, as shown in FIG. 8, to load the second substrate 120 dispensed with the liquid crystal material into the space between the chamber units 210 and 220.

Figure 9:
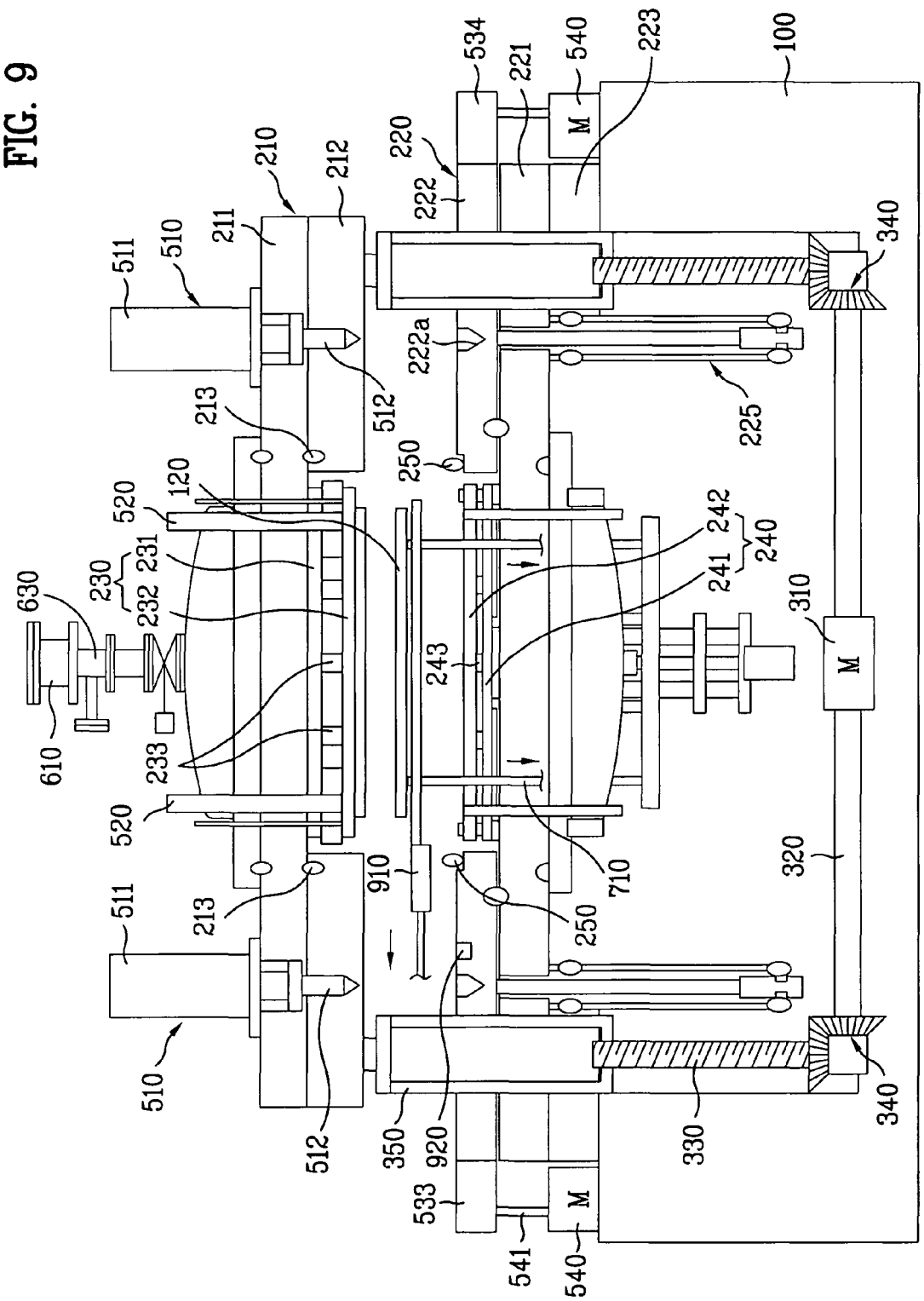
Figure 10:
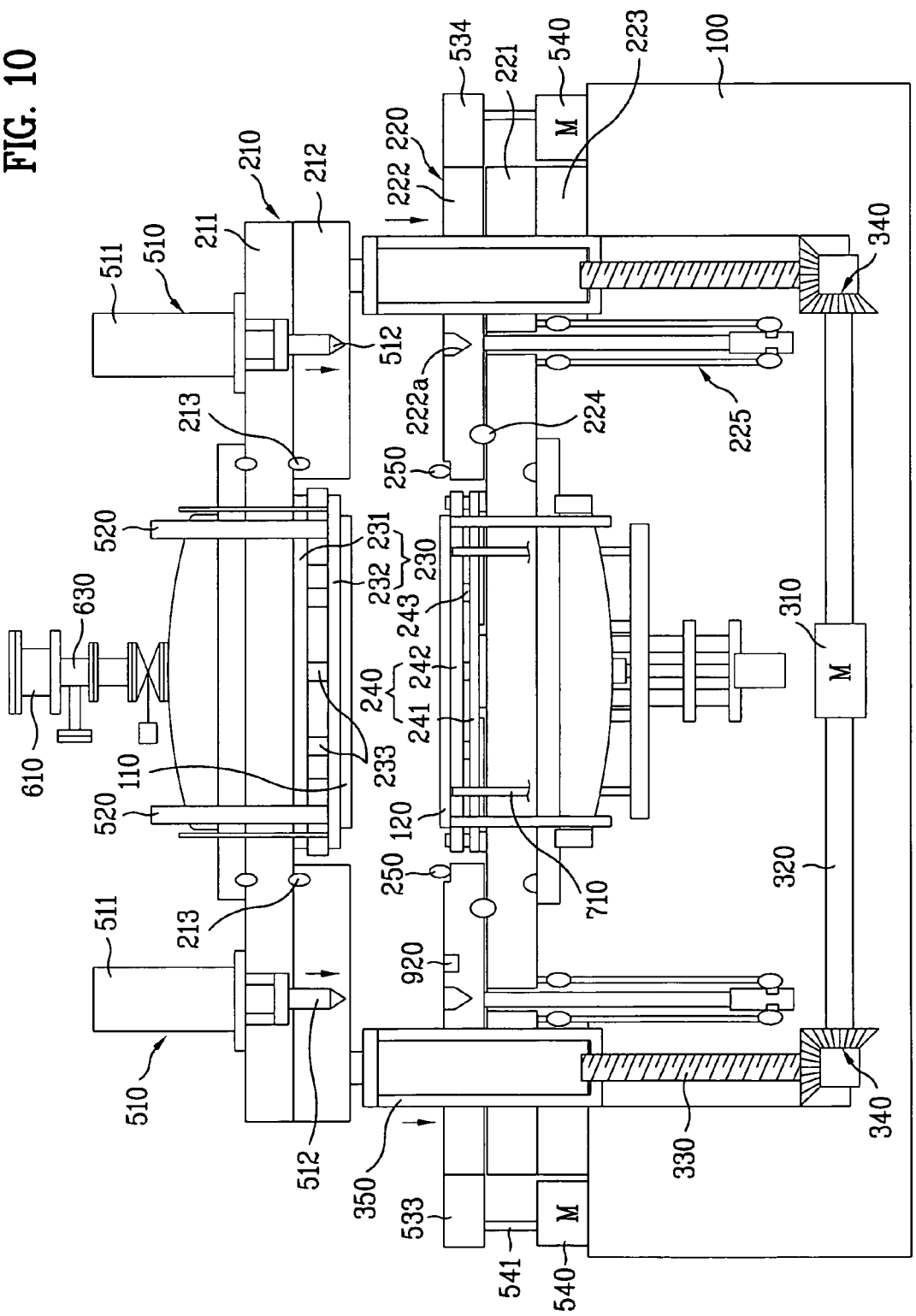

In this state, the lift-pin-shaped supporters 710 upwardly move the second substrate 120 laid on the loader 910 to a predetermined level while moving upwardly through the lower stage 240, as shown in FIG. 9. The loader 910 retracts after the second substrate 120 is separated from the loader 910 in accordance with upward movement of the supporters 710. After the retraction of the loader 910, the supporters 710 move downwardly to seat the second substrate 120 on the lower stage 240, as shown in FIG. 10.

At this time, the lower stage 240 fixes the seated second substrate 120 using a vacuum force and an electrostatic force. The lower chucking plate 242 of the lower stage 240 has the same configuration as the substrate-chucking ESC according to the embodiment of the present invention illustrated in FIG. 1.

After completion of the loading of the substrates 110 and 120, the upper chamber unit 210 is downwardly moved by the chamber mover. In accordance with the downward movement of the upper chamber unit 210, the moving shafts 512 of the linear actuators 511, which are downwardly protruded, are downwardly moved such that they are positioned at a predetermined level.

Figure 11:
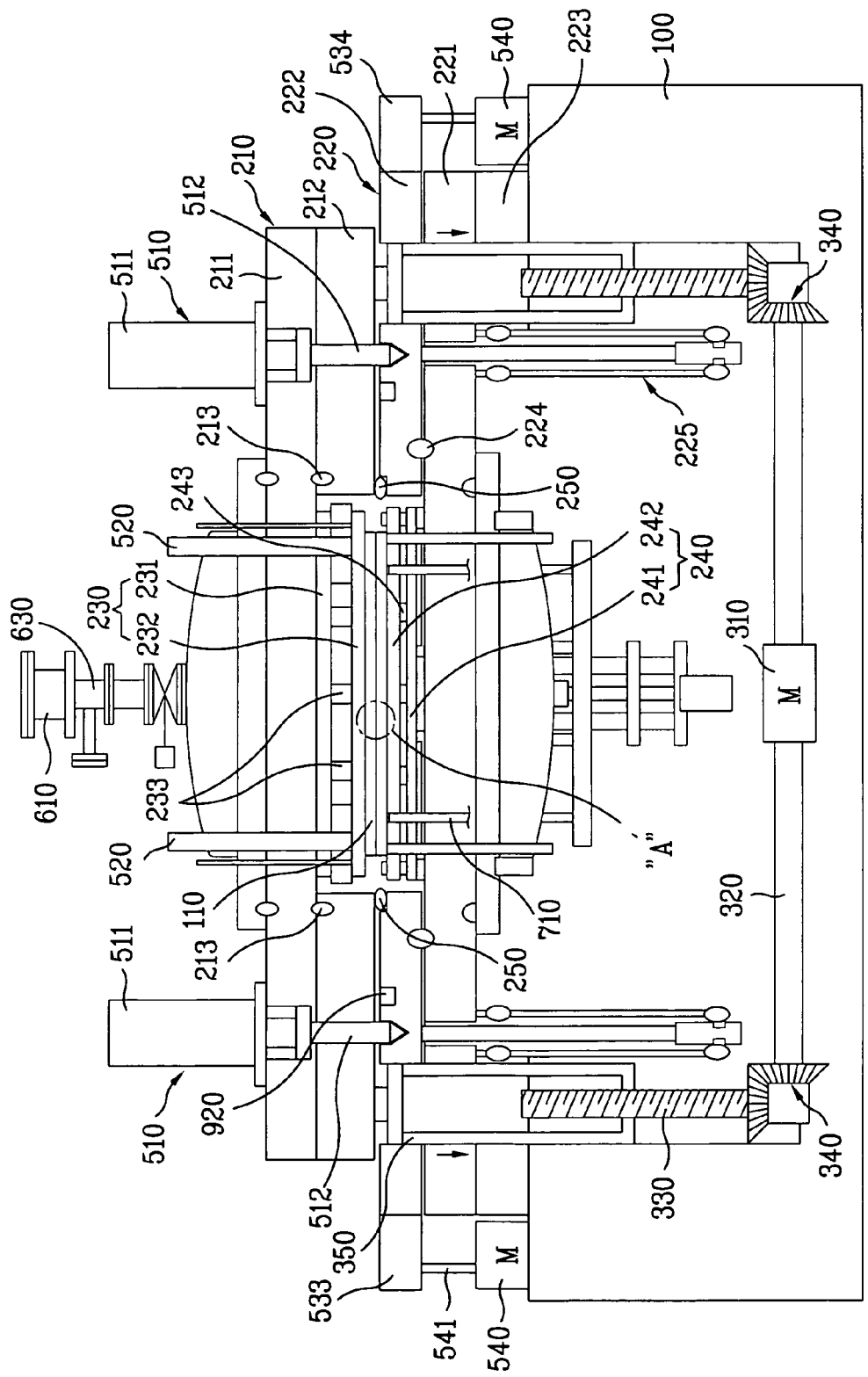
FIG. 11 is a schematic view illustrating operations of the stages for bonding the substrates.

In this case, the moving shafts 512 of the linear actuators 511 are received in the receiving grooves 222a formed at the upper surface of the lower chamber plate 222 of the lower chamber unit 220, as shown in FIG. 11. Also, the upper chamber plate 212 of the upper chamber unit 210 supported by the jacks 350 of the chamber mover comes into contact with the upper surface of the third seal member 250 mounted along the inner peripheral edge of the lower chamber plate 222.

Figure 12:
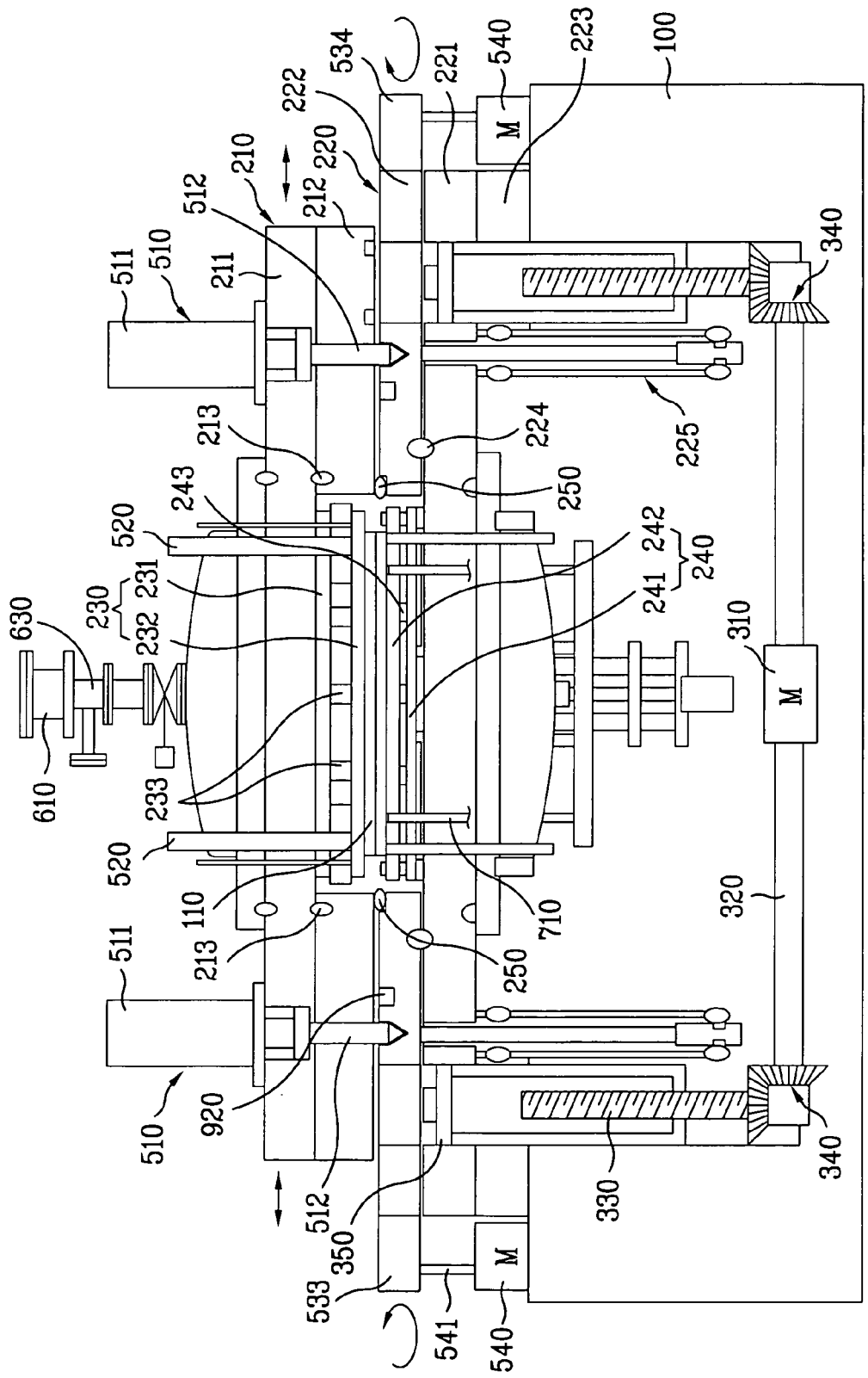
FIG. 12 is a schematic view illustrating alignment of the substrates carried out by an aligner included in the substrate bonding apparatus according to the present invention.

When the jacks 350 further move downwardly from the above-described state, they are separated from the upper chamber unit 210, as shown in FIG. 12. In this state, the inner space defined between the chamber units 210 and 220, in which the substrates 110 and 120 are disposed, is sealed from the outside of the space by the weight of the upper chamber unit 210 and the atmospheric pressure.

In this state, the substrates 110 and 120 respectively attached to the upper and lower stages 230 and 240 are maintained to form a fine gap therebetween without coming into contact with each other. The reason why the substrates 110 and 120 must be maintained in this state is to enable alignment of the substrates 110 and 120 to be carried out, to enable bonding of the substrates 110 and 120 to be carried out in a vacuum state, and thus, to enable complete bonding of the substrates 110 and 120 to be achieved using a pressure difference in a venting process. The gap between the upper and lower chamber units 210 and 220 (or the gap between the substrates) is measured by a gap measuring sensor 920.

Thereafter, the first low-vacuum pump 621 operates to form a vacuum in the space where the substrates 110 and 120 are disposed.

When it is determined, in accordance with a pressure measurement by the pressure sensor 660, that the space where the substrates 110 and 120 are disposed is evacuated to a predetermined vacuum level in accordance with operation of the first low-vacuum pump 621, the high-vacuum pump 610 operates to form a complete vacuum in the space.

When the high-vacuum pump 610 operates, the operation of the first low-vacuum pump 621 is stopped. This is because the high-vacuum pump 610 and first low-vacuum pump 621 use the same conduit, namely, the high-vacuum chamber conduit 630.

When a complete vacuum is formed in the space where the substrates 110 and 120 are disposed, alignment of the substrates is carried out by the alignment identifying cameras 520 and aligner. That is, the alignment identifying cameras 520 observe the alignment marks (not shown) formed on the substrates 110 and 120, to identify a deviation in position between the substrates 110 and 120.

The identified positional deviation is used as a reference to determine the distance by which the upper stage 230 should be moved.

After completion of the identification of the positional deviation, the distance by which the upper stage 230 should be moved is calculated based on the identified positional deviation.

The reason why the distance by which the upper stage 230 should be moved is calculated is that the positional alignment of the substrates 110 and 120 respectively fixed to the stages 230 and 240 should be carried out in accordance with movement of the upper stage 230 because the lower stage 240 is fixed to the upper surface of the lower base 221 such that the lower stage 240 moves separately from the lower chamber plate 222 of the lower chamber unit 220. By contrast, the upper stage 230 is fixed to the upper chamber unit 210 such that the upper stage 230 moves integrally with the upper chamber plate 210 and upper base 211.

When the lower chamber plate 222 is moved in a desired direction by a predetermined distance through the above-mentioned procedure, the upper chamber unit 210 is moved in the same direction by the predetermined distance, integrally with the lower chamber plate 222, in accordance with operation of the linker 710.

Accordingly, the substrates 110 and 120 become completely aligned with each other.

The procedure for aligning the substrates 110 and 120 may not be achieved through a single aligning operation. Where the alignment marks formed at each substrate are divided into rough marks and fine marks, an aligning operation using the fine marks is carried out after an aligning operation using the rough marks.

Figure 13A:
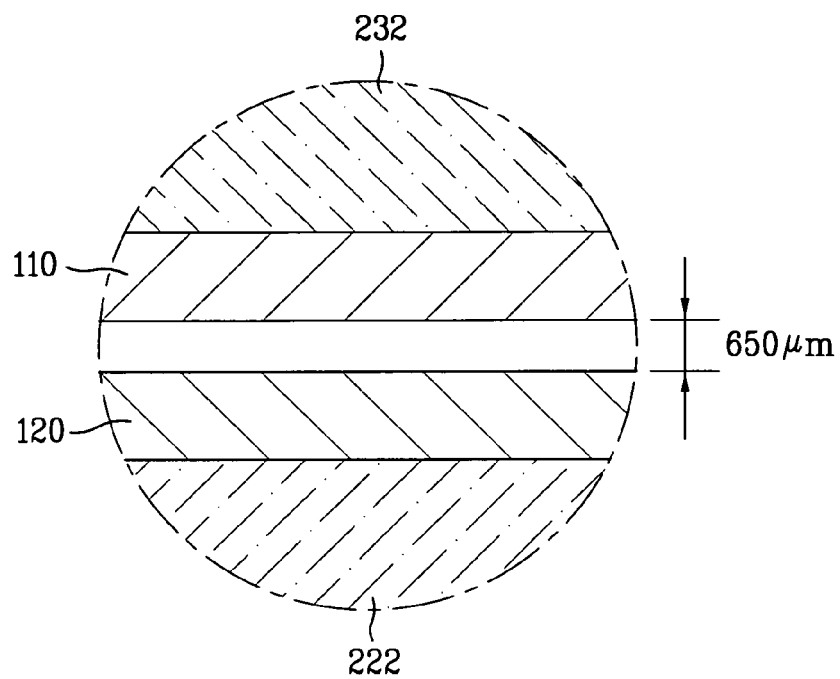
FIGS. 13A and 13B are enlarged views corresponding to a portion A of FIG. 11, respectively.
Figure 13B:
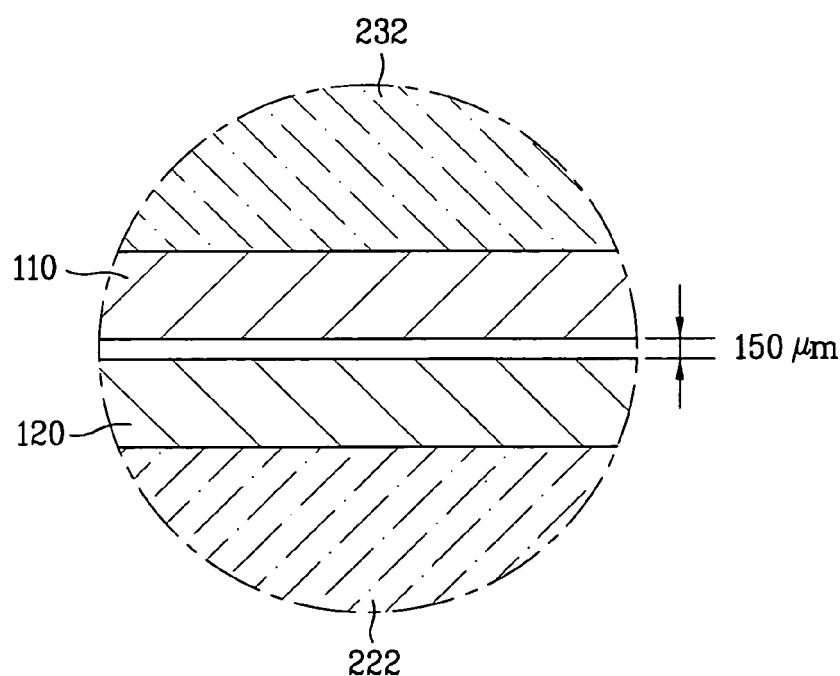

The aligning operation using the rough marks is carried out under the condition in which the distance between the substrates 110 and 120 is about 500 to 800 μm, preferably about 650 μm, as shown in FIG. 13A which is an enlarged view corresponding to a portion A of FIG. 11. On the other hand, the aligning operation using the fine marks is carried out under the condition in which the distance between the substrates 110 and 120 is about 100 to 250 μm, preferably about 150 μm, as shown in FIG. 13B.

Figure 14A:
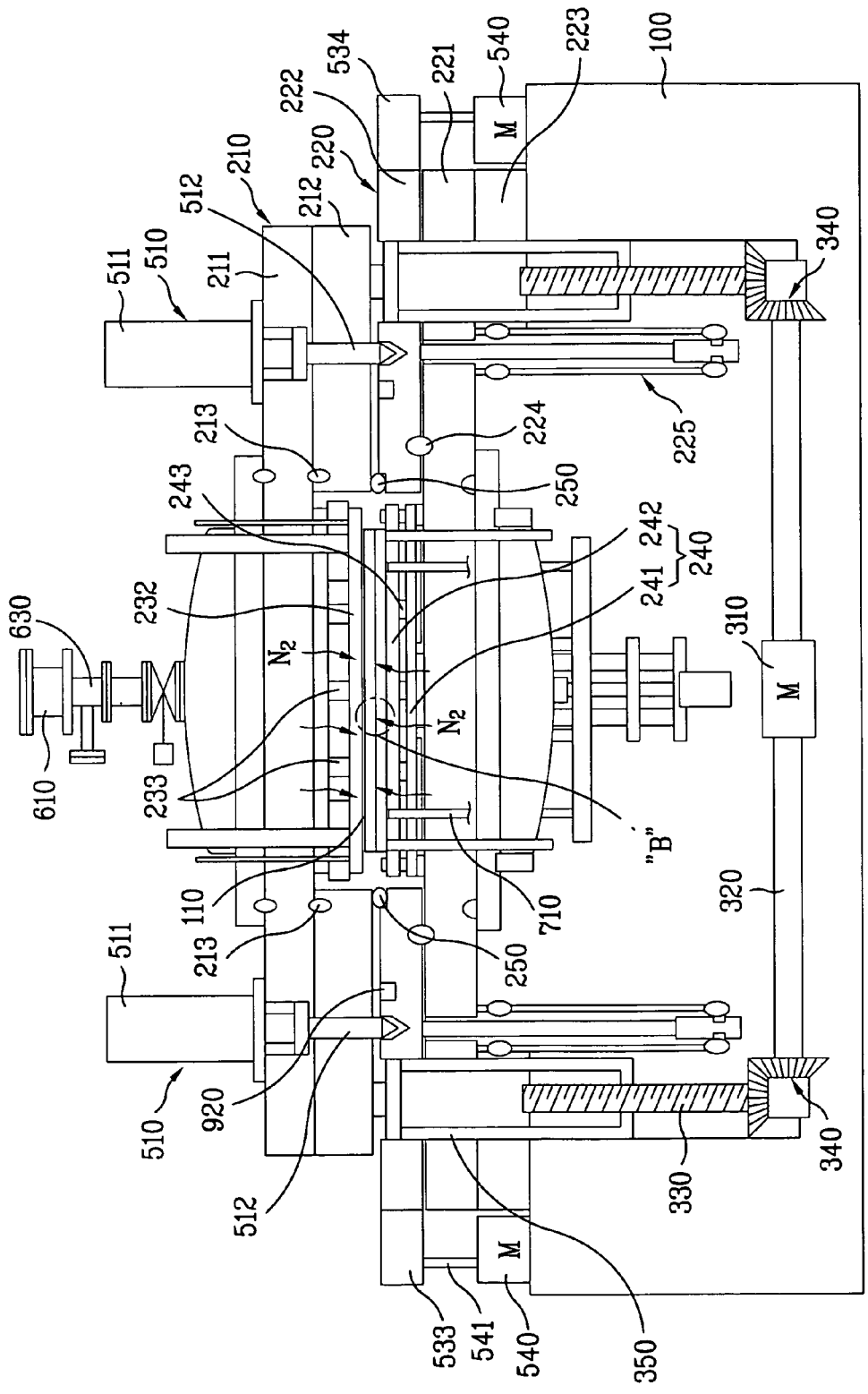
FIG. 14A is a schematic view illustrating a state in which the substrate bonding apparatus is ready to carry out a venting process.
Figure 14B:
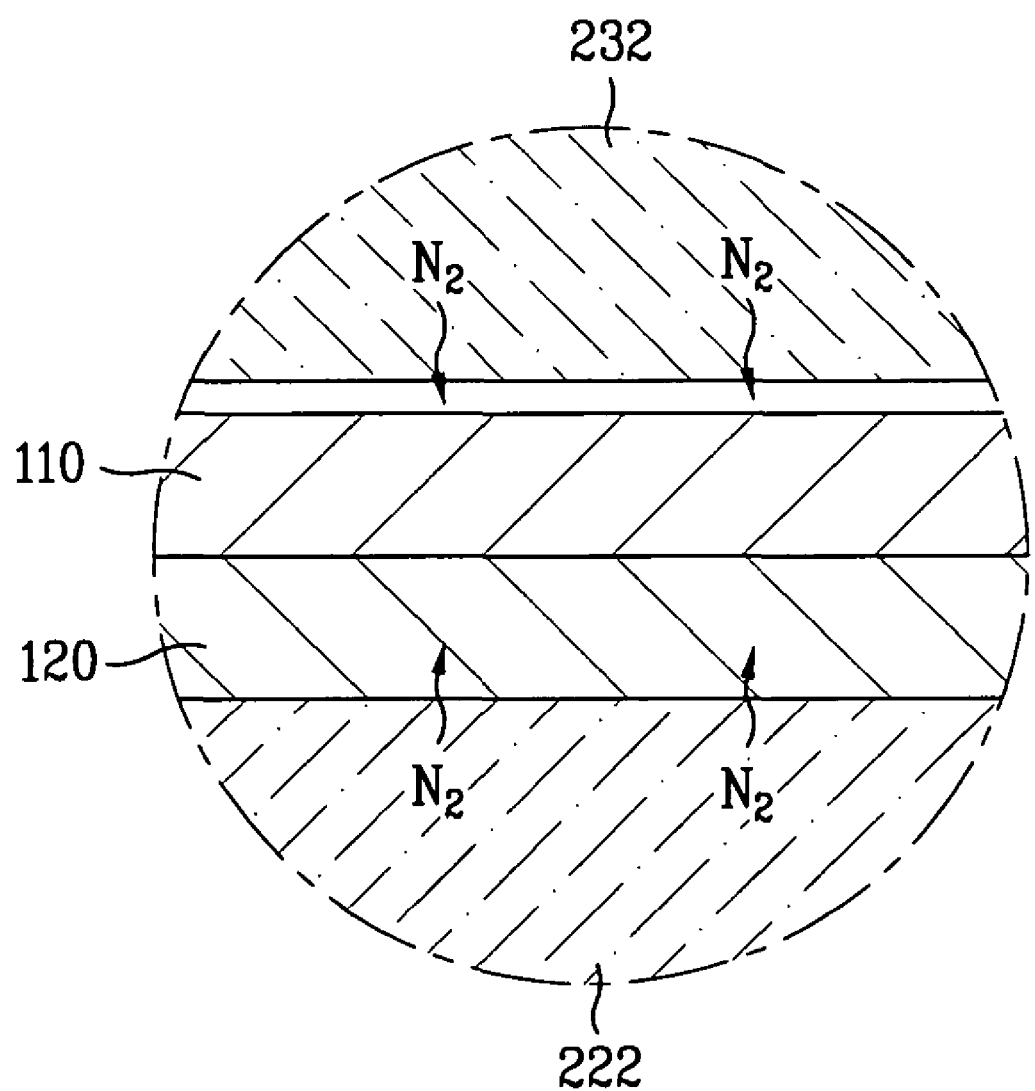
FIG. 14B is an enlarged view corresponding to a portion B of FIG. 14A.

After completion of the alignment of the substrates 110 and 120, supply of a voltage to the upper stage 230 for generation of an electrostatic force is cut off. At the same time, a venting process for evacuating the space where the substrates 110 and 120 are disposed is carried out, as shown in FIGS. 14A and 14B. FIG. 14B is an enlarged view corresponding to a portion B of FIG. 14A.

That is, $N_2$ gas is injected into the space via the low-vacuum chamber conduits 641 and 642 connected to the second vacuum pump 622. As a result, the space is rendered to be in an atmospheric pressure state.

Accordingly, the first substrate 110 chucked to the upper stage 230 is separated from the upper stage 230. At the same time, the first substrate 110 comes into tight contact with the second substrate 120 due to the pressure of the $N_2$ gas discharged out of the upper stage 230. As the venting process is further advanced, the substrates 110 and 120 are completely bonded to each other due to the difference between the pressure exerted between the substrates 110 and 120 and the atmospheric pressure exerted outside the substrates 110 and 120.

That is, since the space defined between the substrates 110 and 120 is maintained in a vacuum state, the substrates 110 and 120 more tightly come into contact with each other by virtue of the difference between the pressure exerted between the substrates 110 and 120 and the atmospheric pressure exerted outside the substrates 110 and 120. As a result, the substrates 110 and 120 are completely bonded to each other.

Thereafter, the bonded substrates 110 and 120 are unloaded. Thus, the bonding procedure is completed.

A bonding procedure for next substrates is carried out, simultaneously with the unloading of the bonded substrates 110 and 120.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

As apparent from the above description, the substrate bonding apparatus according to the illustrated embodiment of the present invention provides various effects.

First, in accordance with the present invention, chucking of a substrate and release of the chucked substrate are achieved by individually controlling voltages respectively applied to at least three groups of electrostatic blocks. Accordingly, it is possible to enhance the uniformity of chucking of a substrate and release of the chucked substrate.

Second, in accordance with the present invention, it is possible to uniformly chuck a substrate using at least three groups of electrostatic blocks even when the substrate is bent due to the weight thereof, and to allow the chucked substrate to fall down uniformly when voltages applied to the electrostatic blocks are cut off.

What is claimed is:

1. A method for bonding a first substrate and a second substrate, comprising the steps of:

applying different voltages to five groups of electrostatic blocks constituting an upper electrostatic chuck, respectively, thereby chucking the first substrate to the upper electrostatic chuck;

applying different voltages to five groups of electrostatic blocks constituting a lower electrostatic chuck, respectively, thereby chucking the second substrate, which has been dispensed with a liquid crystal material, to the lower electrostatic chuck;

lowering the first substrate adhered to the upper electrostatic chuck toward the second substrate with a distance between about 500 to 800 μm and performing a first alignment;

further lowering the first substrate adhered to the upper electrostatic chuck toward the second substrate with a distance between about 100 to 250 μm and performing a second alignment;

uniformly dropping the first substrate from the upper electrostatic chuck at the distance between about 100 to 250 μm toward the second substrate by individually controlling the five different voltages applied to the upper electrostatic chuck to enhance the uniformity of the release of the chucked substrate, after performing the second alignment and before bonding the first and second substrates; and bonding the first and second substrates respectively chucked to the upper and lower electrostatic chucks, wherein the five groups of electrostatic blocks comprise:

a first electrostatic block having sub-blocks arranged at corner portions of the electrostatic chuck having a quadrilateral shape, wherein a first voltage is applied to the first electrostatic block;

a second electrostatic block, having a 2×4 matrix of sub-blocks, arranged at a central portion of the electrostatic chuck having the quadrilateral shape, wherein a second voltage different from the first voltage is applied to the second electrostatic block;

third electrostatic blocks, each having two adjacent sub-blocks, arranged at upper and lower edge portions of the electrostatic chuck having the quadrilateral shape, wherein a third voltage different from the first and second voltages is applied to the third electrostatic blocks;

a fourth electrostatic block, having four adjacent sub-blocks, arranged at a left edge portion of the electrostatic chuck having the quadrilateral shape, wherein a fourth voltage different from the first, second and third voltages is applied to the fourth electrostatic block; and a fifth electrostatic block, having four adjacent sub-blocks, arranged at a right edge portion of the electrostatic chuck having the quadrilateral shape, wherein a fifth voltage different from the first, the second, the third, and the fourth voltages is applied to the fifth electrostatic block.

* * * * *